United States Patent [19]

Tada

[11] Patent Number: 5,495,122
[45] Date of Patent: Feb. 27, 1996

[54] INSULATED-GATE SEMICONDUCTOR FIELD EFFECT TRANSISTOR WHICH OPERATES WITH A LOW GATE VOLTAGE AND HIGH DRAIN AND SOURCE VOLTAGES

[75] Inventor: Gen Tada, Kawasaki, Japan

[73] Assignee: Fuji Electric Co., Ltd., Kanagawa, Japan

[21] Appl. No.: 246,250

[22] Filed: May 19, 1994

[30] Foreign Application Priority Data

May 20, 1993 [JP] Japan .................................... 5-118038

[51] Int. Cl.$^6$ ................................................ H01L 29/76
[52] U.S. Cl. .......................... 257/392; 257/339; 257/369; 257/391
[58] Field of Search ..................... 257/339, 369, 257/391, 392

[56] References Cited

U.S. PATENT DOCUMENTS 4,471,373  9/1984  Shimizu et al. ..................... 257/392

*Primary Examiner*—Edward Wojciechowicz
*Attorney, Agent, or Firm*—Finnegan, Henderson, Farabow, Garrett & Dunner

[57] ABSTRACT

In a low voltage drive circuit section of a semiconductor integrated circuit, the gate oxide films are approximately 250 Å, and a low voltage N-channel IGFET and a low voltage P-channel IGFET are operable at high speed and driven at a low voltage. In a high voltage driven circuit section, the gate oxide films are approximately 1500 Å, and a high voltage N-channel IGFET and a high voltage P-channel IGFET are designed to have a high breakdown voltage performance. In a low gate voltage/high voltage drive circuit section, the gate oxide films are approximately 250 Å, and a high voltage N-channel IGFET is driven at a low gate voltage and operable at high speed. The high voltage N-channel IGFET of the low gate voltage/high voltage drive circuit section has an offset structure including a drain diffusion layer of low concentration, such that the breakdown voltage of the drain is greatly increased.

3 Claims, 5 Drawing Sheets

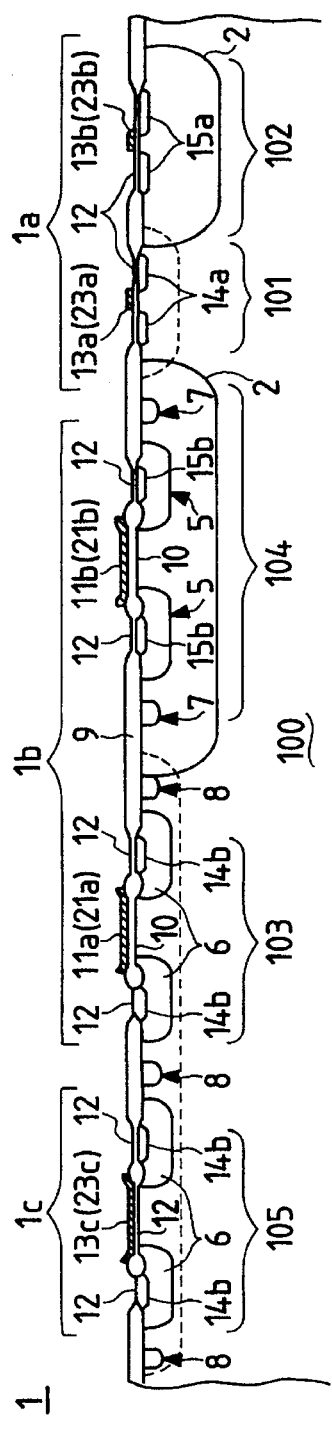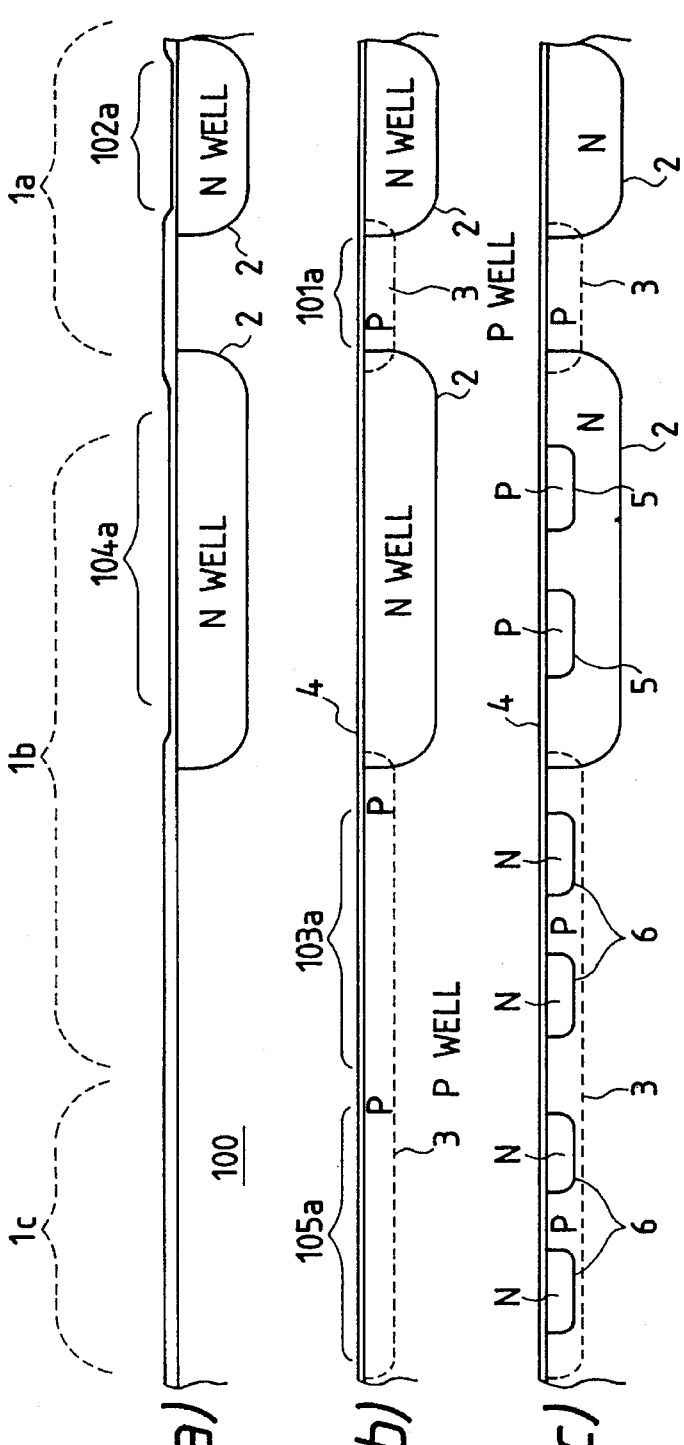
FIG. 1
FIG. 2(a)
FIG. 2(b)
FIG. 2(c)

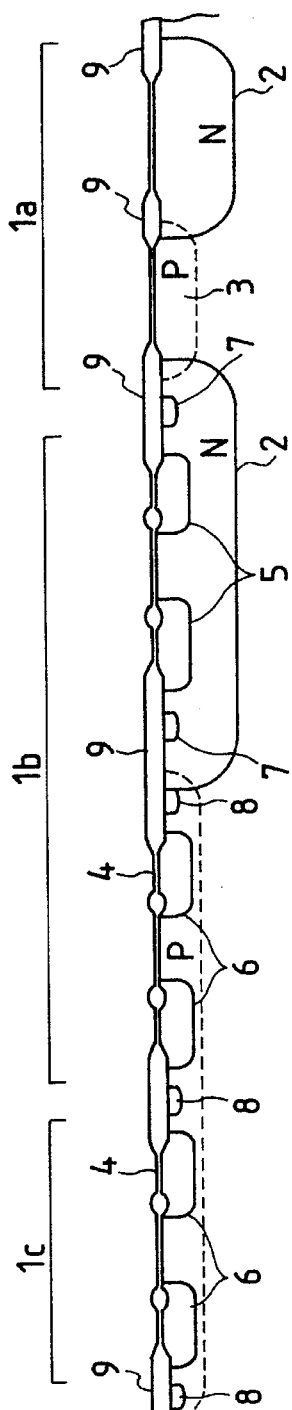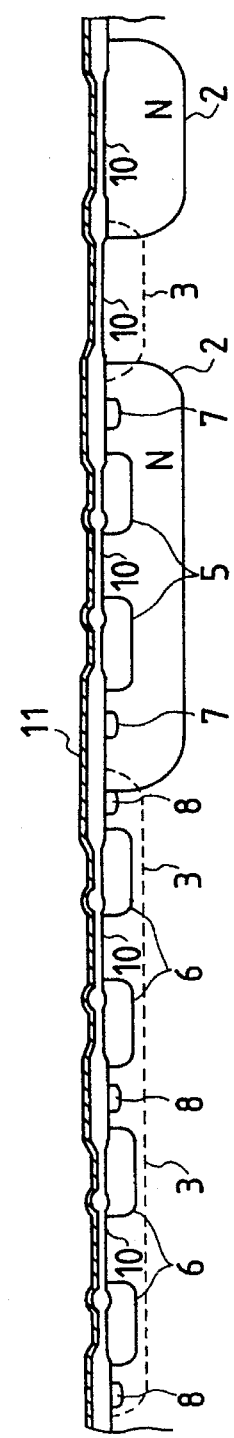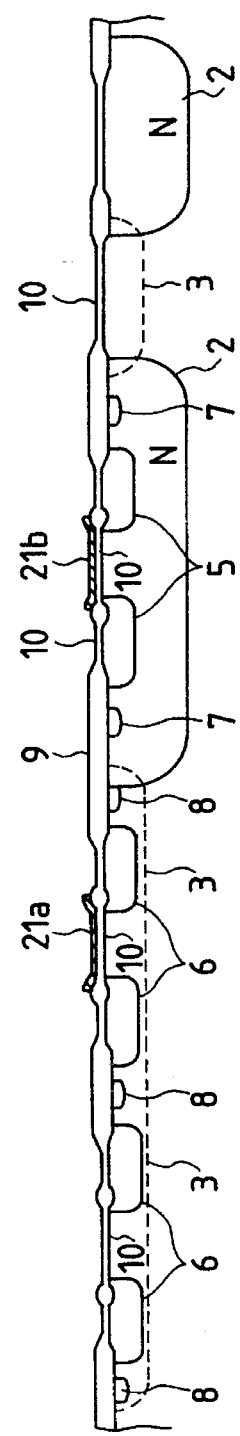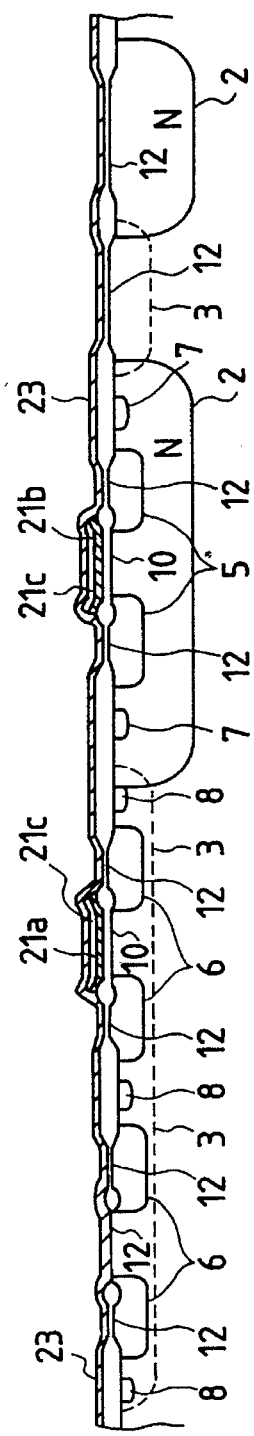
FIG. 3(a)
FIG. 3(b)
FIG. 3(c)
FIG. 3(d)

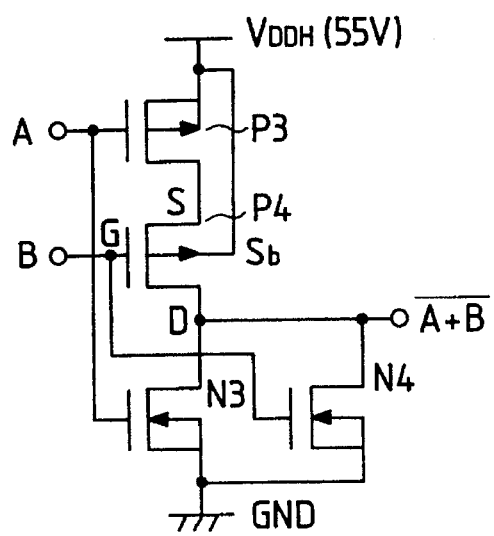
FIG. 4(a)
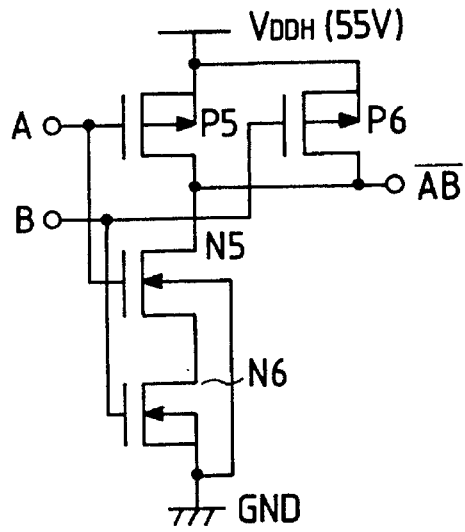
FIG. 4(b)
FIG. 5
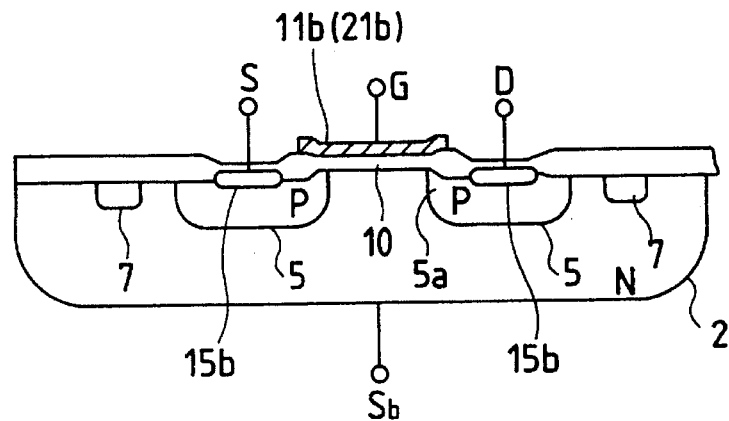
FIG. 6
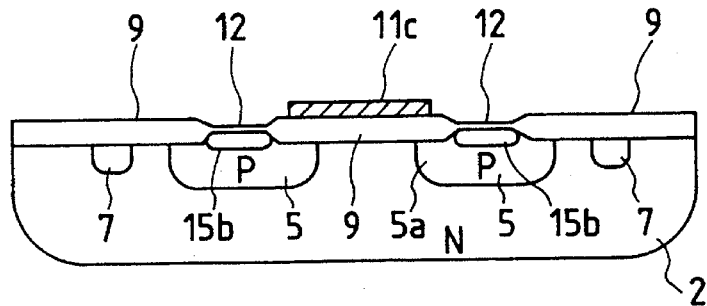

INSULATED-GATE SEMICONDUCTOR FIELD EFFECT TRANSISTOR WHICH OPERATES WITH A LOW GATE VOLTAGE AND HIGH DRAIN AND SOURCE VOLTAGES

BACKGROUND OF THE INVENTION

1. Field of the Invention

The present invention relates to an insulated gate field effect transistor (IGFET) operated with a low gate voltage and a high source and drain voltage, for use in a circuit such as a level shifter in a scan electrode or signal electrode drive integrated circuit for a liquid crystal display (LCD) device. More particularly, the invention relates to improvements of the transistor structure.

2. Description of the Prior Art

A driver section for an n-th signal electrode (n-th output) in a signal electrode drive IC (Y driver) of the 4-level type that is used in an LCD device is shown in FIG. 7. The signal electrode is made up of a latch circuit Ln, operated by a low level logic powder source of 3 V or 5 V, for latching display data for one horizontal period, a level shifter LSn for shifting a low level logic amplitude (between 0 V and 3 V or 5 V) of the latched display data to a high level logic amplitude (between 0 V and 55 V), a decoder Dn for decoding display data signals of a high level logic amplitude and liquid crystal conversion-to-AC signals FR of a high level logic amplitude (between 0 V and 55 V). The signal electrode also includes a voltage selector Sn for selecting one of voltage VDDH (55 V), V3 (45 V), V4 (10 V), and V6 (0 V) in accordance with a select signal of a high level logic amplitude from the decoder and for applying the selected voltage to the n-th output Qn.

A circuit including the latch circuit Ln operates as a low breakdown voltage section Lv for a power source of 3 V or 5 V. A circuit including the level shifter Lsn, the decoder, and the voltage selector Sn operates as a high breakdown voltage section Hv for a power source of 55 V, for example. A plurality of CMOS transistors (complementary insulated gate field effect transistors) are fabricated into these sections.

A CMOS device which includes circuit elements for both low and high breakdown voltage sections Lv and Hv and a method of manufacturing the same are disclosed in U.S. patent application Ser. No. 08/053273 (Japanese Patent Application No. 4-111330). The CMOS gate structure including a low and a high voltage breakdown section will briefly be described in accordance with FIG. 8. The semiconductor device 1 shown in FIG. 8 is a driver IC for an LCD flat panel display device. The driver IC includes a low voltage drive circuit section 1a and a high voltage drive circuit section 1b, which are both formed in the surface region of a monocrystal silicon substrate 100 (semiconductor substrate).

The low voltage drive circuit section 1a is driven at a drive voltage of 5 V or lower. Circuit section la includes a low voltage N-channel IGFET 101 and a low voltage P-channel IGFET 102, both forming a CMOS structure. The low voltage P-channel IGFET 102, formed in the surface region of an N-well of the monocrystal silicon substrate 100, includes a gate oxide film 12 approximately 250 Å thick, a gate electrode 13b made of N-type impurity doped polysilicon, and a P+-type source and drain region 15a. The gate oxide films 12 are approximately 250 Å in thickness. The low voltage N-channel IGFET 101 and the low voltage P-channel IGFET 102 are designed to be operable at high speeds.

The high voltage drive circuit section 1b is driven at a voltage of several tens of volts or higher. Circuit section 1b includes a high voltage N-channel IGFET 103 and a high voltage P-channel IGFET 104, both forming a CMOS structure. The low voltage N-channel IGFET 101, formed in the surface region of a P-well of a monocrystal silicon substrate 100, includes a gate oxide film 12 of approximately 250 Å thick, a gate electrode 13a made of N-type impurity doped polysilicon, and an N+-type source and drain region 14a. The high voltage N-channel IGFET 103, formed in the surface region of a P-well of the monocrystal silicon substrate 100, includes a gate oxide film 10 approximately 1300 Å or greater in thickness, a gate electrode 11a made of N-type impurity doped polysilicon, and an N+-type source and drain region 14b formed in the surface region of an N-type offset diffusion layer 6 of low impurity concentration. The high voltage P-channel IGFET 104, formed in the surface region of an N-well of the monocrystal silicon substrate 100, incudes a gate oxide film 10 approximately 1300 Å or greater in thickness, a gate electrode 11b made of P-type impurity doped polysilicon, and a P+-type source and drain region 15b formed in the surface region of a P-type offset diffusion layer 5 of low impurity concentration. The gate oxide films 10 are approximately 1300 Å or greater in thickness. The high voltage N-channel IGFET 103 and the high voltage P-channel IGFET 104 are designed to have a high breakdown voltage.

In FIG. 8, reference numeral 7 designates an N+ guard ring; 8, a P+ guard ring; and 9, a field oxide film. In the structure of FIG. 8, those portions other than the gate oxide films, which are also designated by reference numeral 12, are formed in the same manner as gate oxide films 12.

In the CMOS structure described above, the CMOS elements in the low voltage drive circuit have thin gate insulating films. The CMOS elements in the high voltage drive circuit include thick gate insulating films and drain in the offset diffusion region of low impurity concentration.

In semiconductor integrated circuits using both low and high voltage power sources, it is sometimes difficult to classify the circuit elements into those exclusively in the low breakdown voltage section Lv and those exclusively in the high breakdown voltage section Hv. For example, in the signal electrode drive IC of the 4-level type shown in FIG. 7, the level shifter LSn located in the boundary region between the low and high breakdown voltage section Lv and Hv may be electrically constructed as shown in FIG. 9. The level shifter receives an output signal of a low level logic amplitude from the latch circuit Ln driven by a low voltage power source (3 V or 5 V) and a high voltage power source VDDH (55 V), and outputs a logic signal of a high level logic amplitude.

In the circuit of FIG. 9, the gate insulating films of P-channel MOS transistors P1 and P2 are thick, e.g., approximately 1500 Å. The same is true for N-channel MOS transistors N1 and N2. Application of low gate voltage of about 5 V to a gate insulating film of approximately 1500 Å thick does not provide a sufficient drive ability (current capacity) when the MOS transistors N1 and N2 are in an on state. For this reason, the CMOS elements are unsuitable for a high speed operation.

In the recent trend of using a 3 V power source for driving a low breakdown voltage section, the drive ability of the latch circuit Ln output is further reduced. In an extreme case, the latch circuit becomes inoperable.

SUMMARY OF THE INVENTION

The present invention has been made in view of the above circumstances and has as an object to provide a semiconductor integrated circuit which enables the improvement of the breakdown voltage and the operating speed of such as IGFET that receives an input signal of a low level amplitude and produces an output signal of a high level amplitude, i.e., an IGFET of a high source-drain voltage that is driven at a low gate voltage.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor integrated circuit of this invention comprises a first IGFET driven at a low gate voltage and a low source drain voltage, a second IGFET driven at a high gate voltage and a high source drain voltage, and a third IGFET driven at a low gate voltage and a high source drain voltage, in which the third IGFET has an offset drain structure with an offset region of low concentration impurity, and the gate insulating film of the third IGFET is thinner than that of a second IGFET. More particularly, the thickness of the gate insulating film of the third IGFET is substantially equal to that of the gate insulating film of the first IGFET, driven at a low gate voltage and a low source-drain voltage.

The third IGFET has an offset drain structure with an offset region of low concentration impurity, and the gate insulating film of the third IGFET is thinner than that of a second IGFET. Therefore, the source-drain breakdown voltage is necessarily high. The current ability of the transistor is improved even at the low gate voltage because of use of the thin gate insulating film. Accordingly, the transistor is operable at high speed.

The thickness of the gate insulating film of the third IGFET is substantially equal to that of the gate insulating film of the first IGFET. Such a thickness of the third IGFET eliminates an addition of a new step in the manufacturing process.

Of the high breakdown voltage IGFETs, the IGFET of which the offset region and the substrate are reversely biased in an on state of the transistor is designed such that the field insulating film is used for the gate insulating film of the IGFET. This very thick gate insulating film lessens the field effect. As a result, carrier concentration action is restricted at the portion of the offset region where it is in contact with the gate insulating film, and further the breakdown voltage is increased. Accordingly, the restriction by the reduction of the breakdown voltage of a specific element can be removed. This feature using the field insulating film contributes to the increase of the breakdown voltage performance of the semiconductor integrated circuit.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings, FIG. 1 is a cross sectional view showing the structure of a semiconductor device according to an embodiment of the present invention;

FIGS. 2(a) to 2(c) are cross sectional views showing a sequence of steps; of a part of the first half of a process of manufacturing a semiconductor device as shown in FIG. 1;

FIGS. 3(a) to 3(d) are cross sectional views showing a sequence of steps of a portion of a second half of a process of manufacturing the semiconductor device as shown in FIG. 1;

FIG. 4(a) is a circuit diagram showing a NOR circuit in a decoder of an LCD integrated circuit;

FIG. 4(b) is a circuit diagram showing a NAND circuit in a decoder of an LCD integrated circuit;

FIG. 5 is a cross sectional view showing the structure of a high breakdown voltage P-channel IGFET;

FIG. 6 is a cross sectional view showing the structure of an improved P-channel IGFET of high breakdown voltage according to the present invention;

DETAILED DESCRIPTION OF THE PREFERRED EMBODIMENTS

Figure 7:
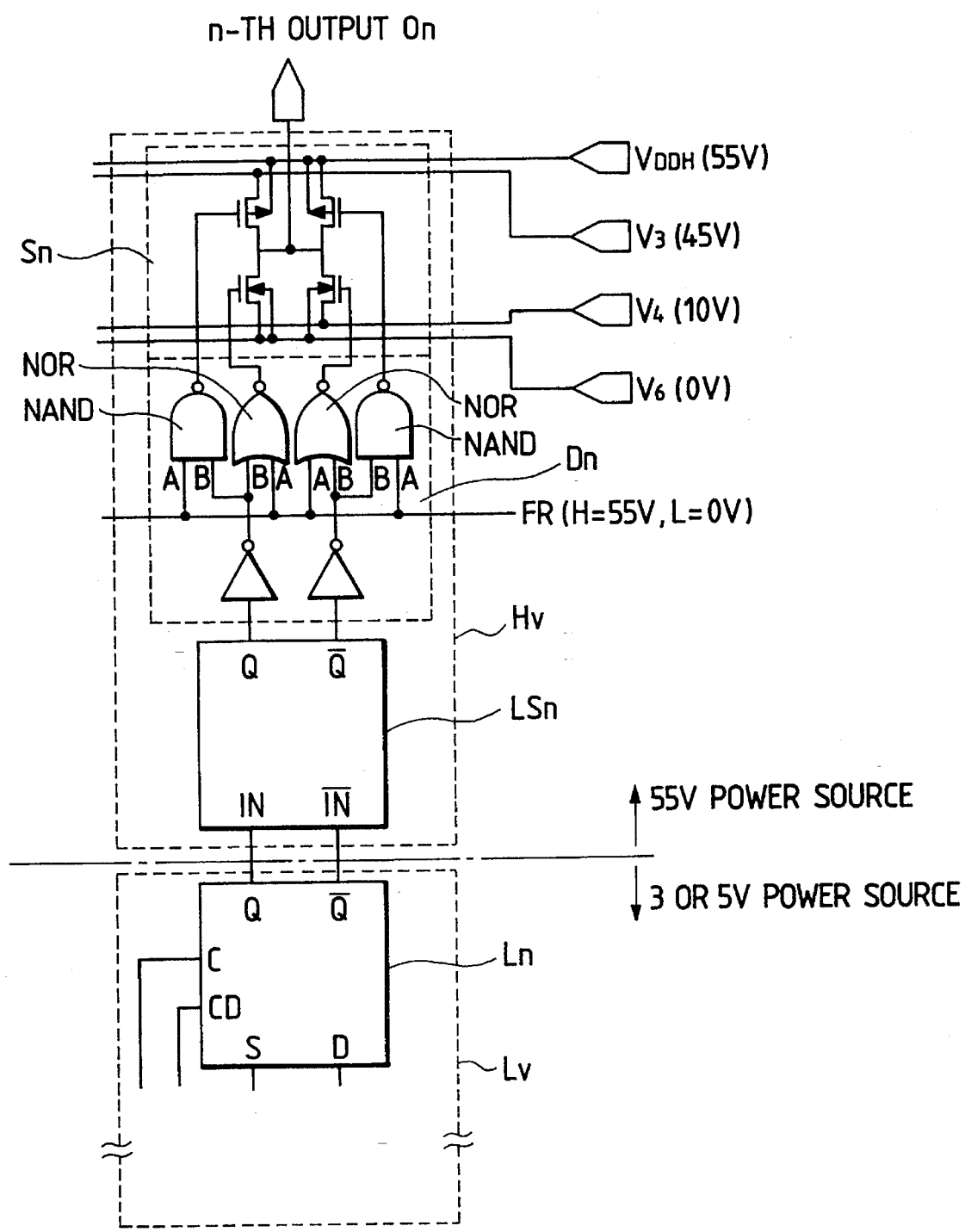
FIG. 7 is a circuit diagram showing the conventional circuit arrangement for each output of an LCD driver integrated circuit.
Figure 8:
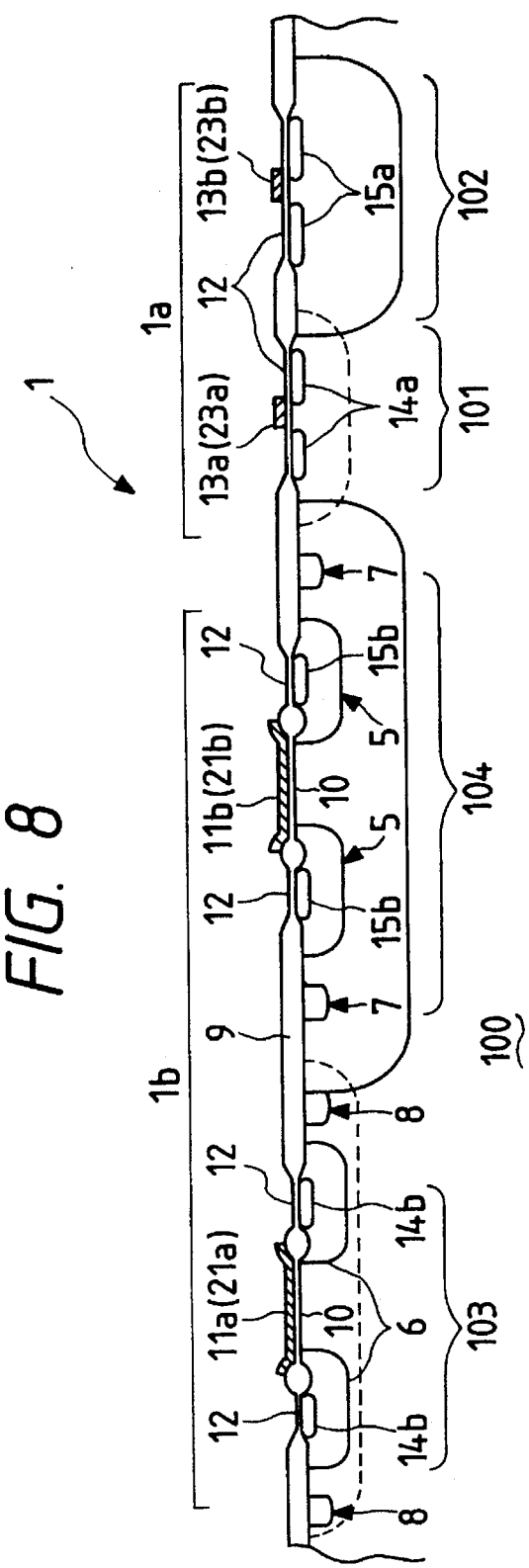
FIG. 8 is a cross sectional view showing the structure of a semiconductor device without the present invention.

The preferred embodiments of the present invention will be described with reference to the accompanying drawings.

In FIG. 1, a semiconductor device 1 is a driver IC for a LCD flat panel display device. The drive IC includes a low voltage drive circuit section 1a, a high voltage drive circuit section 1b, and a low gate voltage/high voltage drive circuit section 1c, all of which are formed in the surface region of a monocrystal silicon substrate 100 (semiconductor substrate).

The low voltage drive circuit section 1a is operated at a drive voltage of 7 V or lower. Circuit section 1a includes a low voltage N-channel IGFET 101 and a low voltage P-channel IGFET 102, both forming a CMOS structure. The low voltage N-channel IGFET 101, formed in the surface region of a P-well of a monocrystal silicon substrate 100, includes a gate oxide film 12 with a thickness of 250 Å, a gate electrode 13a made of N-type impurity doped polysilicon, and an N+-type source and drain region 14a. The low voltage P-channel IGFET 102, formed in the surface region of an N-well of the monocrystal silicon substrate 100, includes a gate oxide film 12 with a thickness of 250 Å, a gate electrode 13b made of N-type impurity doped polysilicon, and a P+-type source and drain region 15a. The gate oxide films 12 in the low voltage drive circuit section 1a are approximately 250 Å in thickness. The low voltage N-channel IGFET 101 and the low voltage P-channel IGFET 102 are designed to operate at high speeds and low drive voltages.

The high voltage drive circuit section 1b is operated at a drive voltage of several tens of volts or higher. Circuit section 1b includes a high voltage N-channel IGFET 103 and a high voltage P-channel IGFET 104, both forming a CMOS structure. The high voltage N-channel IGFET 103, formed in the surface region of a P-well of the monocrystal silicon substrate 100, includes a gate oxide film 10 approximately 1500 Å thick, a gate electrode 11a made of N-type impurity doped polysilicon at low concentration ($3 \times 10^{17}$ $cm^{-3}$ or lower), and an N+-type source and drain region 14b formed in the surface region of an N-type offset diffusion layer 6. The high voltage P-channel IGFET 104, formed in the surface region of an N-well of the monocrystal silicon substrate 100, includes a gate oxide film 10 approximately 1500 Å thick, a gate electrode 11b made of P-type impurity doped polysilicon, and a P+-type source and drain region 15b formed in the surface region of a P-type offset diffusion layer 5 of low concentration ($3 \times 10^{17}$ cm$^{-3}$ or lower). The gate oxide films 10 are approximately 1500 Å thick. The high voltage N-channel IGFET 103 and the high voltage P-channel IGFET 104 are designed to have a high breakdown voltage.

The low gate voltage/high voltage drive circuit section 1c is operated with a drive voltage of 7 V or lower applied to the gate thereof and a drive voltage of several tens of volts or higher applied to the drain. Circuit section 1c includes a high voltage N-channel IGFET 105, which is operated when a drive voltage of 7 V or lower is applied to the gate and has a voltage of several tens V or higher applied to the drain. The low gate voltage type high voltage N-channel IGFET 105, formed in the surface region of a P-well of a monocrystal silicon substrate 100, includes a gate oxide film 12 approximately 250 Å thick, a gate electrode 13c made of N-type impurity doped polysilicon, and a N+-type source and drain region 14b formed in the surface region of a N-type offset diffusion layer 6 of low concentration ($3 \times 10^{17}$ cm$^{-3}$ or lower). The gate oxide film 12 is approximately 250 Å. The high voltage N-channel IGFET 105 is designed to be driven at a low gate voltage, to have an offset drain structure having a low impurity concentration diffusion layer 6. Accordingly, the drain of the high voltage N-channel IGFET 105 has a high breakdown voltage.

In FIG. 1, reference numeral 7 designates an N+ guard ring; 8, a P+ guard ring; and 9, a field oxide film.

A method of manufacturing the semiconductor device of FIG. 1 will be described with reference to FIGS. 2a–c and 3a–c which show sequential steps of a portion of a process of manufacturing a semiconductor device as shown in FIG. 1.

As shown in FIG. 2(a), a monocrystal silicon substrate 100 of CZP (Czochraliski Process) <100> and 10 Ωcm in specific resistance is prepared. Impurities are introduced and diffused into P-channel IGFET regions 102a and 104a forming N-wells 2 each approximately 7 μm deep. Region 102a corresponds to the location of P-channel IGFET 102 of the low voltage drive circuit 1a and region 104a corresponds to the location of P-channel IGFET 104 of the high voltage drive circuit 1b.

As shown in FIG. 2(b), impurities are introduced and diffused into N-channel IGFET regions 101a, 103a, and 105a forming P-wells 3 each approximately 2 μm deep where N-channel IGFETs 101,103, and 105, respectively, are to be formed in the surface regions of the low and high voltage drive circuits 1a and 1b and the low gate voltage/ high voltage drive circuit section 1c. During the diffusion process, a base oxide film 4 of approximately 400 Å is formed over the surface of the monocrystal silicon substrate 100.

As shown in FIG. 2(c), low impurity concentration, P-type offset diffusion layers 5 of approximately 1.5 μm deep are formed in the P-channel IGFET forming region 104a where the source and drain of the P-channel IGFET 104 are to be formed in the high voltage drive circuit section 1b. Low impurity concentration N-type offset diffusion layers 6 of approximately 1.5 μm deep are formed in the N-channel IGFET forming regions 103a and 105a where the sources and drains of the N-channel IGFETs 103 and 105 are to be formed in the high voltage drive circuit section 1b and the low gate voltage/high voltage drive circuit section 1c.

As shown in FIG. 3(a), N+ guard rings 7 and P+ guard rings 8 are successively formed for isolating high voltage IGFETs from one another. The guard rings are formed in the high voltage drive circuit section 1b and the low gate voltage/high voltage drive circuit section 1c. Following the formation of the guard rings, field oxide films 9 are formed. To form the field oxide films, a selective diffusion process is carried out using a silicon nitride film mask.

After removal of the base oxide film 4, as shown in FIG. 3(b), a gate oxide film 10 approximately 150 Å is formed by subjecting the structure to wet oxidation at approximately 900° C. for approximately 70 minutes. The gate oxide film 10 is necessary for the IGFETs formed in the high voltage drive circuit section 1b. A first polysilicon layer 11 of approximately 4500 Å is formed on the surface of the gate oxide film by a chemical vapor deposition (CVD) method. The structure is then annealed at approximately 900° C. in an inactive gas.

A resist layer is then formed on the surface of the first polysilicon layer 11 so that after processing by dry etching and removing, polysilicon layers 21a and 21b are formed as the gate electrodes 11a and 11b in the high voltage drive circuit section 1b as shown in FIG. 3.

Using the un-doped polysilicon layers 21a and 21b in the high voltage drive circuit section 1b as a mask, the structure is wet etched, using HF aqueous solution, to remove the gate oxide films 10 is the active regions (gate electrode forming regions and the source-drain forming regions) in the low voltage drive circuit section 1a and the low gate voltage/ high voltage drive circuit section 1c.

The surface is then wet oxidized at approximately 800° C. for approximately 40 minutes to form a gate oxide film 12 of approximately 250 Å, as shown in FIG. 3(d). During this process, the surface regions of the polysilicon layers 21a and 21b are oxidized to form silicon oxide films 21c. The surface regions of the polysilicon layers 21a and 21b are more easily oxidized than the surface of the monocrystal silicon substrate 100 so the resulting silicon oxide films 21c is approximately 400 Å. Subsequently, a second polysilicon layer 23 of 4500 Å is formed on the surface regions of the gate oxide film 12 and the silicon oxide films 21c by a CVD method.

Phosphorous is doped, at high concentration, into the entire surface of the second polysilicon layer 23, giving the second polysilicon layer 23 an N-type conductivity.

Then, a resist layer is formed on the surface of the second polysilicon layer 23, patterned, processed by dry etching, and removed, so that as shown in FIG. 1, polysilicon layers 23a, 23b, and 23c (gate electrodes 13a, 13b, and 13c) are left only in prescribed regions in the low voltage drive circuit section 1a and the low gate voltage/high voltage drive circuit section 1c. The polysilicon layers 23a, 23b, and 23c are already conductive and may be used as the gate electrodes 13a, 13b, and 13c without further processing.

During the dry etching process mentioned above, the silicon oxide films 21c are present on the surfaces of the polysilicon layers 21a and 21b. When the subsequent dry etching is stopped by the gate oxide film 12, the polysilicon layers 21a and 21b in the high voltage drive circuit section 1b are left intact. A selected ratio of silicon and silicon oxide film in the dry etching process is approximately 10:1. At the completion of the etching process for the second polysilicon layer 23, if the gate oxide film 12 and the silicon oxide films 21c are exposed, the etching rate rapidly decreases. Accordingly, the termination of etching the second polysilicon layer 23 can be controlled.

As a result, the gate oxide films 12 of approximately 250 Å are formed in the low voltage drive circuit section 1a and the low gate voltage/high voltage drive circuit section 1c, and the gate oxide films 10 of approximately 1500 Å are formed in the high voltage drive circuit section 1b.

The subsequent process of manufacturing IGFETs will be described with reference to FIG. 1.

Ions are implanted into the low voltage drive circuit section 1a using a mask of the polysilicon layers 23a and 23b, into the high voltage drive circuit section 1b, using polysilicon layers 21a and 21b, and into the low gate voltage/high voltage drive circuit section 1c using a mask of the polysilicon layer 23c, along with the field oxide films 9, forming source and drain diffusion regions 14a, 15a, 14b, and 15b in the low voltage drive circuit section 1a, the high voltage drive circuit section 1b, and the low gate voltage/high voltage drive circuit section 1c.

Through the ion implantation, the polysilicon layers 21a and 21b in the high voltage drive circuit section 1b become conductive. As a result, these layers become the gate electrodes 11a and 11b of the same conductivity type as that of the corresponding source and drain diffusion regions 14b and 15b.

Contact holes, wirings, and passivation films are successively formed following this ion implantation process. As a result, a low voltage N-channel IGFET 101 and a low voltage P-channel IGFET 102 are formed in the low voltage drive circuit section 1a. A high voltage N-channel IGFET 103 and a high voltage P-channel IGFET 104 are formed in the high voltage drive circuit section 1b. A high voltage N-channel IGFET 105 operable with a low gate voltage drive is formed in the low gate voltage/high voltage drive circuit section 1c.

Figure 9:
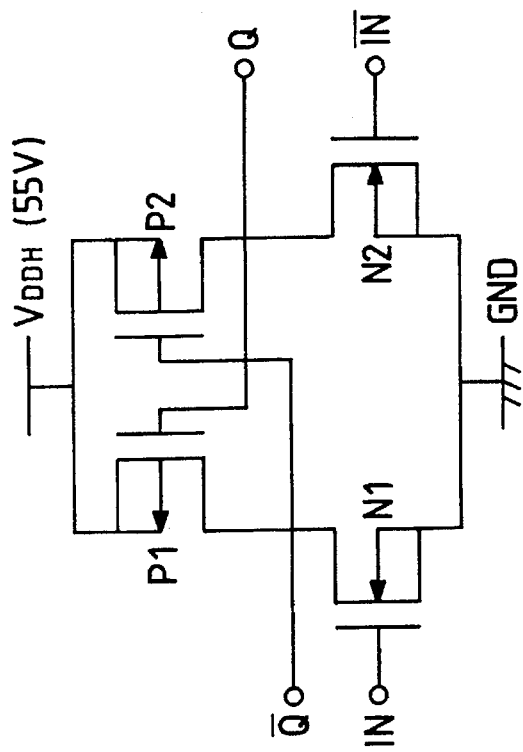
FIG. 9 is a circuit diagram showing a latch circuit in an LCD driver integrated circuit.

In the level shifter shown in FIG. 9 including the IGFETs P1, P2, N1, and N2, high voltage of 55 V is applied to the gates of the IGFETs P1 and P2. Low voltage (3 V or 5 V) is applied to the gates of the IGFETs N1 and N2. Accordingly, the high voltage P-channel IGFETs 104 are used for the IGFETs P1 and P2. The high voltage N-channel IGFETs 105 are used for the IGFETs N1 and N2. As a result, the IGFETs N1 and N2 have high breakdown voltage performances and are operable at high speed.

The saturation, region current $I_{sat}$ of the FET is generally proportional to the capacitance $C_{ox}$ of the gate insulating film (gate oxide film). This capacitance $C_{ox}$ is proportional to the thickness $T_{ox}$ of the gate insulating film (gate oxide film). Then, the following relation holds.

$$I_{sat} \propto 1/T_{ox}$$

From the above relation, it is seen that when the gate oxide film is decreased from 1500 Å (of the conventional one) to 250 Å, the current is increased by approximately six times. High voltage (e.g., 55 V) is at the drains of the MOS transistors N1 and N2 when these transistors are in an off state. Therefore, the breakdown of the drains of the transistors must be comparable with that of other high breakdown voltage FETs. If the drain diffusion layers 6 have the offset structure shown in FIG. 1 and low impurity concentration ($3 \times 10^{17}$ cm$^{-3}$ or lower), such a high breakdown voltage can be attained. Additionally, because the thickness of the gate electrode of the high voltage N-channel IGFET 105 in the low gate voltage/high voltage drive circuit section 1c is equal to thickness of the gate electrodes of the IGFETs 101 and 102 in the low voltage drive circuit section 1a no additional steps are required in the manufacturing process.

A NOR circuit shown in FIG. 4(a) and a NAND circuit shown in FIG. 4(b) are used in the decoder Dn of the LCD driver circuit shown in FIG. 7. The gates of the IGFETs P3 to P6 and N3 to N6 in the NOR and NAND circuits receive the output signal of a high level logic amplitude (55 V) from the level shifter LSn. Therefore, the high voltage IGFETs 103 and 104 shown in FIG. 1 are used for transistors P3 to P6 and N3 to N6. Accordingly, the NOR and NAND circuits should be in a high breakdown voltage section.

In those circuits, only the P-channel IGFET P4 in the NOR circuit of FIG. 4(a) and the N-channel IGFET N5 in the NAND circuit of FIG. 4(b) exhibit a decreased breakdown voltage in a specific operation mode to be described. As a result of the decrease in the breakdown voltage of P4, the NOR circuit operation is restricted. This restricted operation of the NOR circuit will be described using the P-channel IGFET P4.

Consider a first state where input A to the NOR circuit of FIG. 4(a) is at a low potential (L) level and the input B is at a high potential (H) level. The source S, the gate G, and the substrate Sb of the P-channel IGFET P4 are at an H level and the drain D is at an L level. In this state, the P-channel IGFET P4 is in an off state. Referring to FIG. 5, hole discharging action, to lower the concentration of holes in P-type offset layer 5 to change its conductivity state to P$^-$, due to the field plate effect at the end of the gate electrode 11b when the gate electrode is at an H level, takes place at the portion 5a where the P-type offset diffusion layer is in contact with the gate oxide film 10. The breakdown voltage of the P-type offset diffusion layer 5 of the drain and the substrate N-well 2 is 80 V or higher.

Consider a second state where the input A is at an H level and the B is at an H level. In this state the P-channel IGFET P4 is in an on state and the source S, the gate G, and the substrate Sb are at an H level, and the drain D is at an L level. In this state, the field plate effect provides a satisfactory withstand voltage.

Consider a third state, where the input A is in an L level and the input B is in an L level. In this state, the gate G is at an L level, and the source S, the drain D, and the substrate Sb are at an H level. The P-channel IGFET P4 is an off state. The P-type offset diffusion layer 5 (drain) and the substrate (N-well 2) are forwardly biased. No problem arises in the breakdown voltage performance.

Consider a fourth state where the input A is at an H level and the input. B is at an L level. The source S, the drain D and the gate G are at an L level, and only the substrate Sb is at an H (55 V) level. Holes concentration action, to lower the concentration of holes in the P-type offset layer 5 to change the conductivity state of the P-type offset layer 5 to P+, due to the reverse field plate effect occurs at the portion 5a of the P-type offset layer 5. The depletion layer narrows, and the breakdown voltage deceases to approximately 60 V between the P-type offset diffusion layer 5 (drain) and the substrate (N-well 2). More specifically, when the transistor is in an on state and the junction between the offset diffusion layers 5 and the N-well 2 are reverse biased, the field effect of the gate potential disadvantageously increases the concentration of holes at the portion 5a of the P-type offset layer 5, resulting in reduction of the breakdown voltage. For this reason, the breakdown voltage of the P-channel IGFET P4 in the NOR circuit is temporarily reduced to about 60 V in the specific state as mentioned above, while the remaining IGFETs P3, N3, and N4 have an 80 V breakdown voltage.

Accordingly, the NOR circuit operation is restricted to within this 60 V reduced breakdown voltage. As similar reduction in the breakdown voltage will also take place in the N-channel IGFET N5 in the NAND circuit, restricting its operation to within approximately 60 V.

To cope with this problem, a high voltage P-channel IGFET 107 structured as shown in FIG. 6 is employed in the present invention. This structure uses a thick field oxide film 9 of approximately 8000 Å as the gate oxide film under the gate electrode 11c. When the gate voltage is L, the field effect concentrates holes at the portion 5a of the P-type offset layer 5 where it is in contact with the gate oxide film 9. Using a field oxide film 9 as the gate insulating film thicker than 1500 Å lessens the field effect. Use of this thicker gate insulating film also eliminates the addition of a new process step.

Additionally, use of the thicker field oxide film 9 reduces the saturation region current of the FET, as mentioned above. The reduction of the saturation current at the gate voltage of 55 V is approximately 20% because of the following two reasons. First, the gate electrode of the IGFET P4 is driven by high voltage (55 V). Second, the saturation region current in the IGFET of the offset drain structure is not greatly affected by the gate voltage in the high gate voltage region, but is restricted by a drain resistance. This saturation current reduction creates no problems in practical use. The advantage of increased breakdown voltage resulting from the use of the thick field oxide film overcomes any reduction of the decrease of the saturation current.

The problem of the restriction caused by the reduction of the breakdown voltage reduction of the N-channel IGFET N5 in the NAND circuit can be solved by using the field oxide film in place of the gate oxide film in the offset drain structure of the N-type IGFET. The mechanism of operation is similar to that mentioned above.

As described above, the present invention is characterized in that a third IGFET operated at a low gate voltage and a high source and drain voltage has an offset drain structure with an offset region of low impurity concentration, and the gate insulating film of the third IGFET is thinner than that of a second IGFET. Therefore, the invention has the following advantageous effects.

1) The source and drain breakdown voltage is high. The current ability of the transistor is improved even at the low gate voltage because of use of the thin gate insulating film. Accordingly, the transistor may operate at high speed.

2) The thickness of the gate insulating film of the third IGFET is substantially equal to that of the gate insulating film of a first IGFET, operated at a low gate voltage and a low source and drain voltage. Such a thickness of the third IGFET eliminates an addition of a new step in the manufacturing process.

Of the high breakdown voltage IGFETs, the IGFET of which the offset region and the substrate are reversely biased in an on state of the transistor is designed such that the field insulating film is used for the gate insulating film of the IGFET. This very thick gate insulating film lessens the field effect. As a result, carrier concentration action is restricted at the portion of the offset region where it is in contact with the gate insulating film, and further the breakdown voltage is increased.

Accordingly, the restriction caused by the reduction of the breakdown voltage of a specific element can be eliminated. Using the field insulating film as the gate insulating film increases the breakdown voltage performance of the semiconductor integrated circuit.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor integrated circuit comprising:
   a first insulated gate semiconductor field effect transistor (IGFET) having a first gate, a first source, and a first drain operated with a low gate voltage level and a low source-drain voltage level;
   a second IGFET having a second gate, a second source, and a second drain operated with a high gate voltage level substantially greater than the low gate voltage level and a high source-drain voltage substantially greater than the low source-drain voltage level; and
   a third IGFET having a third gate, a third source, and a third drain operated with the low gate voltage level on the third gate, and the high source-drain voltage level, said third IGFET having a high impurity drain region in a low impurity drain region, and a gate insulating film of the third IGFET is thinner than that of a gate insulating film of the second IGFET.

2. A semiconductor integrated circuit according to claim 1,
   wherein the gate insulating film of the third IGFET is substantially equal in thickness to that of a gate insulating film of the first IGFET.

3. A semiconductor integrated circuit having a substrate and a plurality of insulated gate semiconductor field effect transistors (IGFETs), each having a gate, a drain, and a source, formed thereon, at least one of the IGFETs comprising:
   a high impurity drain region in a low impurity drain region, the low impurity drain :region between the gate and the drain and the substrate being reversely biased when the IGFET is in an on state; and
   a gate insulating film made of a field oxide film and having a thickness greater than the thickness of a gate insulating film for another of the plurality of IGFETs for which the substrate is not reversely biased, such that field effect is lessened, carrier concentration action is restricted at a portion of the low impurity drain region in contact with the gate insulating film, and breakdown voltage is increased.

\* \* \* \* \*

UNITED STATES PATENT AND TRADEMARK OFFICE
CERTIFICATE OF CORRECTION

PATENT NO. : 5,495,122
DATED : February 27, 1996
INVENTOR(S) : Gen TADA

It is certified that error appears in the above-indentified patent and that said Letters Patent is hereby corrected as shown below:

Claim 3, column 10, line 48, delete ":".

Signed and Sealed this

Nineteenth Day of November, 1996

Attest:

BRUCE LEHMAN

*Attesting Officer*  *Commissioner of Patents and Trademarks*